(12) United States Patent
King et al.

(10) Patent No.: US 8,111,059 B1
(45) Date of Patent: Feb. 7, 2012

(54) ELECTRIC CURRENT LOCATOR

(75) Inventors: Paul E. King, Corvallis, OR (US);
Charles Rigel Woodside, Corvallis, OR (US)

(73) Assignee: The United States of America as represented by the United States Department of Energy, Washington, DC (US)

( * ) Notice: Subject to any disclaimer, the term of this patent is extended or adjusted under 35 U.S.C. 154(b) by 269 days.

(21) Appl. No.: 12/695,197

(22) Filed: Jan. 28, 2010

(51) Int. Cl.
*G01R 15/18* (2006.01)
(52) U.S. Cl. ............... 324/117 R; 324/117 H; 373/94
(58) Field of Classification Search .............. 324/117 R, 324/117 H, 76.78; 373/60, 65, 94; 361/143; 702/64

See application file for complete search history.

(56) References Cited

U.S. PATENT DOCUMENTS 6,605,936 B1 * 8/2003 Tamai et al. .............. 324/117 R

OTHER PUBLICATIONS

Ward et al, "Ensemble Arc Motion and Solidification During the Vacuum Arc Remelting of a Nickel-based Superalloy," proc. Int. Symp. Liquid Metal Processing and Casting, Santa Fe, Sep. 18-21 (2005).

Yachikov et al, "Electromagnetic Processes in a DC Arc-Furnace Bath with an Arbitrarily Located Bottom Electrode," Russian Metallurgy (Metally), vol. 2007, No. 7, pp. 571-575 (2007).

Swart et al, "Arc-skewing in DC arc furnaces and its compensation," energize, pp. 57-61, Aug. 2008.

\* cited by examiner

*Primary Examiner* — Arleen M Vazquez
(74) *Attorney, Agent, or Firm* — James B. Potts; Mark P. Dvorscak; John T. Lucas

(57) ABSTRACT

The disclosure herein provides an apparatus for location of a quantity of current vectors in an electrical device, where the current vector has a known direction and a known relative magnitude to an input current supplied to the electrical device. Mathematical constants used in Biot-Savart superposition equations are determined for the electrical device, the orientation of the apparatus, and relative magnitude of the current vector and the input current, and the apparatus utilizes magnetic field sensors oriented to a sensing plane to provide current vector location based on the solution of the Biot-Savart superposition equations. Description of required orientations between the apparatus and the electrical device are disclosed and various methods of determining the mathematical constants are presented.

16 Claims, 7 Drawing Sheets

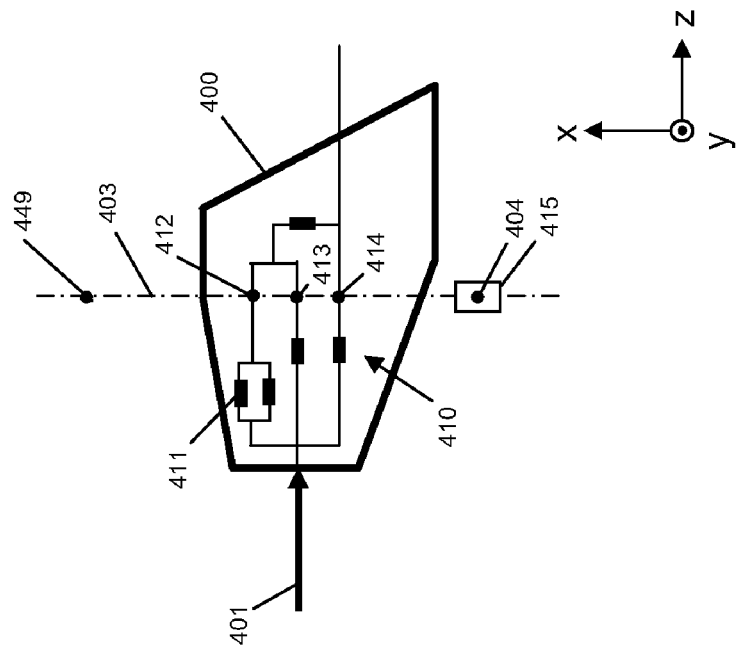
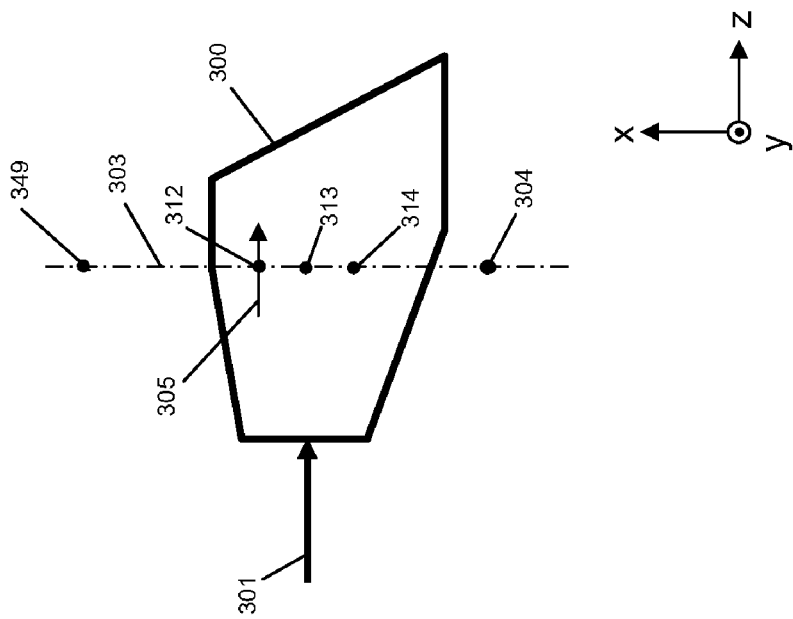
Fig. 4
Fig. 3

ELECTRIC CURRENT LOCATOR

STATEMENT OF GOVERNMENTAL SUPPORT

The United States Government has rights in this invention pursuant to the employer-employee relationship of the Government to the inventors as U.S. Department of Energy employees and site-support contractors at the National Energy Technology Laboratory.

TECHNICAL FIELD

The disclosure herein provides an apparatus for location of a current vector in an electrical device, where the current vector has a known direction and a known relative magnitude to an input current supplied to the electrical device. The apparatus utilizes magnetic field sensors oriented to a sensing plane and provides current vector location based on the solution of Biot-Savart equations formulated for the specific electrical device.

BACKGROUND OF THE INVENTION

It is understood that if all currents in a system are known, then the magnetic field can be determined from the currents by the Biot-Savart equation. The Biot-Savart equation allows the determination at a fixed point by integration over the path of the currents to find the total magnetic field at that point. The application of this law implicitly relies on the superposition principle for magnetic fields, i.e. the fact that the magnetic field is a vector sum of the field created by each infinitesimal section of the wire individually. However, magnetic inverse problems, where the determination is approached in reverse order so that a current distribution may be determined based on the magnetic field produced, are significantly more problematic. The prediction of physical parameters based on the sensed magnetic fields of an electrical device tends to result in highly nonlinear formulations, and it becomes difficult to construct effective inversion algorithms. In general, these formulations do not have a unique solution, and regularization techniques are needed.

In spite of these difficulties, the remote sensing of electrical device current is an area of highly active interest due to the clear advantage afforded by non-obtrusive measurement. Typically the applications are performed in such a way that the mathematical issues arising in inverse problems are avoided. For example, magnetic current imaging as used heavily in the semiconductor industry relies on the magnetic fields produced in current carrying paths, and conducts inspection by comparing the magnetic field images produced by devices under inspection with the images produced by fault-free devices, as well as comparison with the circuit schematic. This technique allows identification of currents occurring outside of design pathways and a rough estimation of magnitudes depending on the resolution of the magnetic field sensor involved, however the nature of the process precludes an exact solution for the location and magnitude of any offending current vector. Additionally, the technique is based on a finite number of well defined current paths in the fault-free devices, and is not suited to a situation where an electrical device might experience significant deviation in the current pattern from one finished item to the next. For example, the crucible section in an arc furnace, where currents would be expected during the normal course of operation, but where the location and magnitude of the current vectors comprising any formulation of the overall current pattern would also be expected to continually change based on both the operating condition and inherent inhomogeneity existing from one furnace to the next. Such a system precludes approaches that rely on comparison with a pre-determined and definable normal operating condition.

There is also a history of utilizing sensed magnetic fields in order to troubleshoot machinery in operation, and identify possible causes of observed abnormalities. These methods are typically utilized for diagnosis of electromagnetic motors and generators, where common faults can be inserted and the resulting impact on the electromagnetic signature sensed at a specific location can be evaluated. In application, the operating device is periodically monitored and the electromagnetic signature sensed is compared with an existing library of magnetic signatures to indicate possible sources of an abnormality. This is a widely used technique which continues to be refined. See, e.g., Bui et al, *"Non Invasive Faults Monitoring of Electrical Machines by Solving Steady State Magnetic Inverse Problem," Knowledge-Based Intelligent Information and Engineering Systems: KES 2007-WIRN* 2007, Springer (2007), among others. However, the methodology is similar to magnetic current imaging in that diagnosis is limited to defined fault locations, and is thus restricted to either diagnosis of common faults or identification of a general region where a fault may be located. The method does not provide a manner in which the sensed magnetic field may be interpreted in a mathematically continuous way, so that a remotely sensed parameter may serve to locate one or more current vectors with precision within an electrical device.

There are also known devices such as clamp-on ammeters which indicate a magnitude of current passing through a conductor by sensing the magnetic field generated by the conductor, and determining the current magnitude by assuming the current is centered in the conductor and flowing in a straight line over the region where the magnetic field is sensed. The validity of the devices is limited to the conditions assumed, and location of the current vector producing the magnetic field is strictly limited to the center of the conductor. Such devices do not allow interpreting a sensed magnetic field in a mathematically continuous way, so that one or more current vectors having undefined location may be located with precision within an electrical device.

Thus, the methods fall short in applications where it becomes necessary or desired to utilize a remotely sensed magnetic field to locate one or more current vectors in an electrical device where the current vectors may routinely operate outside defined paths, or where the nature of the electrical device itself precludes analysis of well defined current paths within the device. It would be advantageous to provide a system where the magnetic field of an electrical device could be monitored and the location of one or more current vectors within the electrical device could be precisely located. It would be particularly useful in applications where the location of the current vectors is expected to routinely alter over the course of normal operation of the electrical device. For example, where the electrical device is an arc furnace, and where the one or more current vectors represent the arc across the electrode arc gap. It would further be advantageous to provide a system where exact definition of the currents occurring outside the current vector in question is not required, so that magnetic inversion issues do not arise and precise location of the current vector can be determined without necessary determination of the remaining current field.

Accordingly, it is an object of this disclosure to provide a system whereby an exact solution for the location of a quantity of current vectors in an electrical device can be determined directly from remotely sensed magnetic field parameters.

Further, it is an object of this disclosure to provide a system whereby the exact solution for the location of a quantity of current vectors does not rely on restriction of the current vector to well defined current paths within the electrical device.

Further, it is an object of this disclosure to provide a system whereby the exact solution for the location of a quantity of current vectors may be determined in an electrical device that experiences poorly defined current patterns over the course of normal operation.

Further, it is an object of this disclosure to provide a system whereby a sensed magnetic field may be interpreted in a mathematically continuous way, so that a remotely sensed parameter may serve to locate a quantity of current vectors with precision within an electrical device.

These and other objects, aspects, and advantages of the present disclosure will become better understood with reference to the accompanying description and claims.

SUMMARY OF INVENTION

The novel apparatus disclosed herein provides localization of one or more current vectors in an electrical device, where the one or more current vectors have a known direction and a known relationship to an input current supplied to the device. The electrical device may be any device which receives an input current and produces a magnetostatic field in response.

The novel apparatus utilizes one or more magnetic field sensors oriented on a sensing plane, where the sensing plane is oriented substantially perpendicularly to the one or more current vectors to be localized, and where the one or more magnetic field sensors sense the magnitude of the magnetic field in two directions on the sensing plane. The one or more magnetic field sensors and an input current measurement device is in data communication with a processor. The processor receives the data communication and localizes the one or more current vectors using Biot-Savart superposition equations applicable to the specific electrical device and the orientation of the novel apparatus disclosed.

The Biot-Savart superposition equations utilized by the processor are functions of the mathematical constants $m_x$, $m_y$, a, and b in addition to other measured parameters, as discussed supra. The mathematical constants $m_x$, $m_y$, a, and b are determined by a mathematical regression of calibration data, where the calibration data is comprised of the magnetic field in two directions at the location of the one or more magnetic field sensors, the location of the current vector producing that magnetic field, and the relative magnitudes of the input current and the current vector. The calibration data is taken over a finite number of points and fit to the Biot-Savart equation, such that the processor is able to describe the current vector location in a mathematically continuous expression during operation of the electrical device.

The calibration data determining the mathematical constants $m_x$, $m_y$, a, and b may be generated by finite element analysis of the electrical device and simulation of appropriate parameters, in order to determine the magnetic field expected at the one or more magnetic field sensors under a finite number of conditions. Alternatively, the calibration data may be determined by supplying an input current to the electrical device and physical manipulation of the electrical device such that a current vector having a known relationship to the input current exists at a specified point on the sensing plane. In the latter method, the magnetic field produced at the one or more magnetic field sensors is measured under a finite number of conditions. Using the calibration data thus determined, the mathematical constants $m_x$, $m_y$, a, and b result from mathematical regression of the calibration data to Biot-Savart superposition equations. The mathematical constants $m_x$, $m_y$, a, and b thus determined are defined for the specific electrical device, the location and orientation of the novel apparatus described herein, and the relationship between the input current and the current vector to be located.

In a particular embodiment, the electrical device is an arc furnace and the one or more current vectors to be localized is one or more electric arcs bridging the electrode gap of the arc furnace during operation. This embodiment provides a real-time location of the electric arc, so that the time-averaged distribution of the electric arc during arc furnace operation can be evaluated, and the arc furnace parameters can be adjusted to achieve the desired diffuse arc condition.

The disclosure herein thus provides an electric current locator where one or more current vectors may be localized in an electrical device directly from remotely sensed magnetic field parameters. The electric current locator provides localization without restricting of the current vector to well defined current paths within the electrical device. This allows localization in electrical devices that routinely experience poorly defined current patterns over the course of normal operation. This capability stems from treating sensed magnetic field parameters as arising from as Biot-Savart superposition equations, and the determination of appropriate calibration data such that the Biot-Savart superposition equations may be utilized as a mathematically continuous description of current vector location.

The novel apparatus and principles of operation are further discussed in the following description.

BRIEF DESCRIPTION OF THE DRAWINGS

FIG. 3 illustrates an electrical device having poorly defined current paths receiving an input current, and generating a current vector at a plurality of locations.

FIG. 4 illustrates an electrical device having well-defined current paths and receiving an input current, and generating a current vector at a plurality of locations.

DETAILED DESCRIPTION OF THE PREFERRED EMBODIMENTS

The following description is provided to enable any person skilled in the art to use the invention and sets forth the best mode contemplated by the inventor for carrying out the invention. Various modifications, however, will remain readily apparent to those skilled in the art, since the principles of the present invention are defined herein specifically to provide an apparatus for localizing one or more current vectors in an electrical device, where the one or more current vectors have a known direction and a known magnitude relative to an input current supplied to the electrical device.

The apparatus utilizes one or more magnetic field sensors oriented on a sensing plane, where the sensing plane is oriented substantially perpendicularly to the one or more current vectors to be located, and where the at least one magnetic field sensor senses the magnitude of the magnetic field in two directions on the sensing plane. The apparatus describes the location of the current vector by determining the point of intersection between an intersect vector coincident with the current vector and the sensing plane. The apparatus senses the magnetic field in two directions on the sensing plane and utilizes a processor in order to solve mathematically continuous Biot-Savart superposition equations based on calibration data determined for a specific electrical device. In one embodiment, the electrical device is an arc furnace, and the apparatus serves to provide a location of the electric arc exiting the electrode during arc furnace operation. The calibration data is generated using a finite number of current location points, and the Biot-Savart superposition equations are fit to the calibration data in order to provide a mathematically continuous description of current vector location based on the finite number of points.

These and other aspects and advantages of the apparatus will become better understood with reference to the following description and claims.

Principles of the Method

Figure 1:
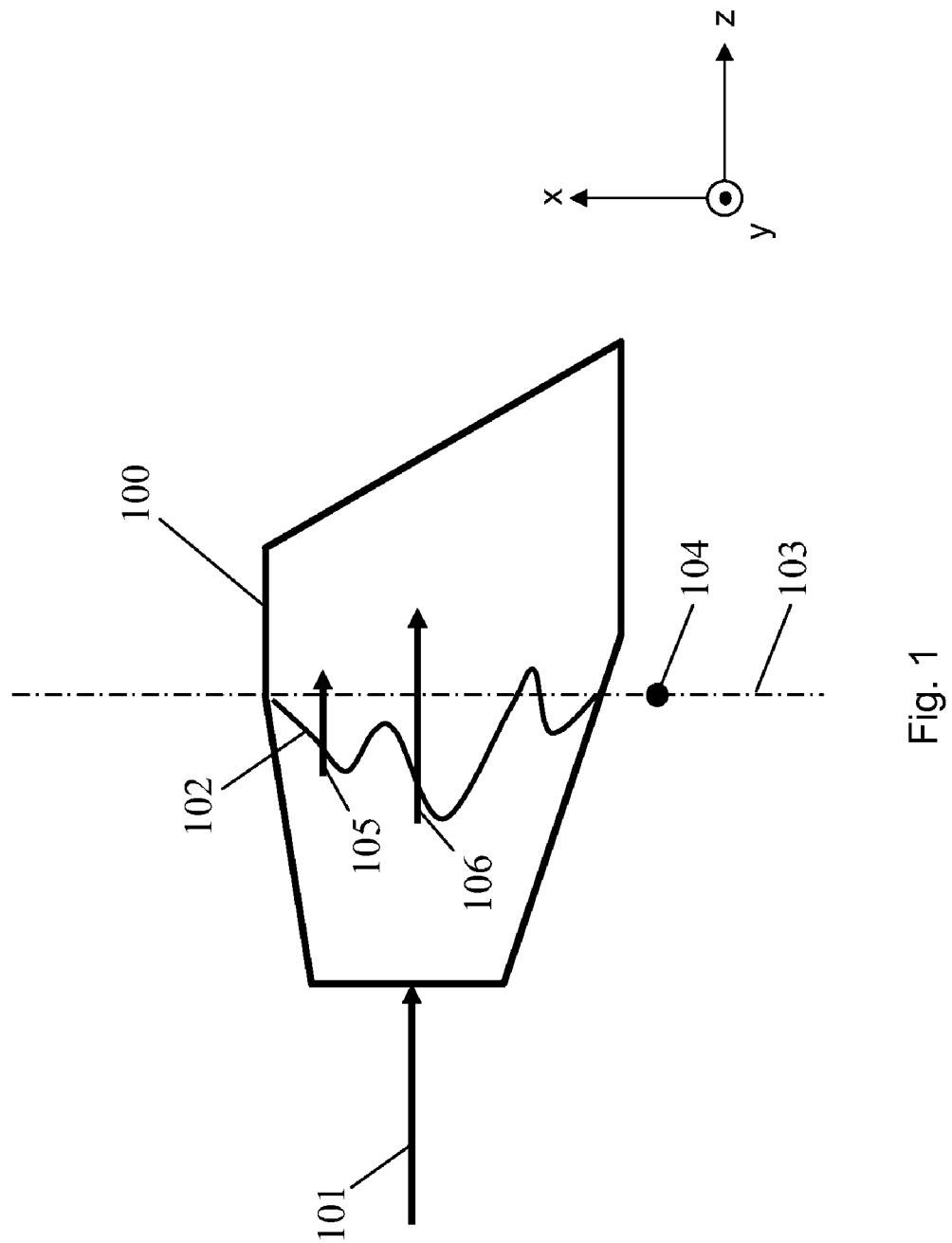
FIG. 1 illustrates an electrical device receiving an input current and generating a current vector and a superposition vector perpendicular to a sensing plane, as viewed in the x-z plane.

FIG. 1 illustrates an electrical device 100. Electrical device 100 is a three-dimensional object oriented with respect to the x-y-z axis shown, where the y-axis is illustrated as proceeding out of the page. Electrical device 100 receives an input current 101, and in response to input current 101, electrical device 100 experiences current flow 102 across sensing plane 103. Sensing plane 103 is a plane having dimension in the x-y axes only.

Electrical device 100 may be any device which receives an input current and generates a current flow 102 across sensing plane 103. Additionally, although current flow 102 is illustrated in two-dimensions at FIG. 1, current flow 102 may be a three-dimensional current vector field having y-axis components. In application, it would typically be expected that current flow 102 is a three-dimensional current vector field. Additionally, although current flow 102 is represented as an essentially continuous gradient across sensing plane 103 for illustrative purposes, current flow 102 may also be a series of geometrically well-defined currents transiting sensing plane 103 while confined to rigorous conducting paths. For example, current flow 102 could be a plurality of current vectors flowing in accordance with an electrical schematic, so that each current vector comprising current flow 102 intersects sensing plane 103 at a well-defined and known point in the x-y-z coordinate system.

As is well known, current flow 102 will cause electrical device 100 to emanate a magnetic field. If the magnetic field is modeled by a magnetostatic approximation, where electrostatic charges are ignored and the magnetic field is presumed essentially constant with respect to time, then the magnetic flux density B of the magnetic field may be described at a point in space using the Biot-Savart law. Generally speaking, magnetostatics may serve as an adequate approximation even if current flow 102 is not static, provided that current flow 102 does not alternate rapidly. Electrical processes occurring in the 60 Hz range have been treated using the Biot-Savart law without significant error. See e.g., Griffiths et al, *Introduction to Electrodynamics*, Prentice Hall, Englewood Cliffs, N.J.

(1999). As a result, and assuming current flow 102 produces a magnetostatic field, the Biot-Savart law may be utilized to describe the magnetic flux density B arising from current flow 102 at point 104, illustrated at FIG. 1, where point 104 is a location lying within sensing plane 103. Further, the magnetic flux density at point 104 may be expressed vectorially as $B=B_x+B_y+B_z$, where component subscripts indicate vector components with respect to the x-y-z axis shown. Using the nomenclature of FIG. 1 therefore, the magnetic flux density B at point 104 is comprised of components $B_x$ and $B_y$ extending from point 104 and lying within sensing plane 103, and component $B_z$ extending from point 104 and having a perpendicular orientation to sensing plane 103.

In the absence of extraneous magnetic fields in the surrounding environment, the components $B_x$ and $B_y$ of magnetic flux density B at point 104 results from superposition of all magnetic fields resulting from the current vectors making up current flow 102. As discussed supra, the nature of electrical device 100 dictates the nature of current flow 102. However, in terms of producing the magnetic field components $B_x$ and $B_y$ at point 104, it is possible to represent the current flow 102 as current vector 105 and superposition vector 106, where current vector 105 and superposition vector 106 are oriented perpendicular to sensing plane 103, and where current vector 105 and superposition vector 106 have respective magnitudes such that $B_x$ and $B_y$ at point 104 result. Further, if the intersection of superposition vector 106 and sensing plane 103 is maintained at a constant position with respect to point 104, then the Biot-Savart equations describing $B_x$ and $B_y$ at point 104 may be expressed as:

$$B_x = m_x l_n [(\sin \Theta)/d - a] \quad (1)$$

$$B_y = m_y l_n [(\cos \Theta)/d - b] \quad (2)$$

where $m_x$, $m_y$, a, and b are mathematical constants, and where $l_n$ is the magnitude of current vector 105, d is the magnitude of a position vector from point 104 to the intersection of current vector 105 with sensing plane 103, and $\Theta$ is the angle between the position vector and some reference axis which lies in sensing plane 103, and which passes through point 104 and the intersection point between superposition vector 106 and sensing plane 103. The value of the mathematical constants $m_x$, $m_y$, a, and b are dependent on the location of the superposition vector 106, the electromagnetic nature of electrical device 100, and the relationship between input current 101 and current vector 105.

Figure 2:
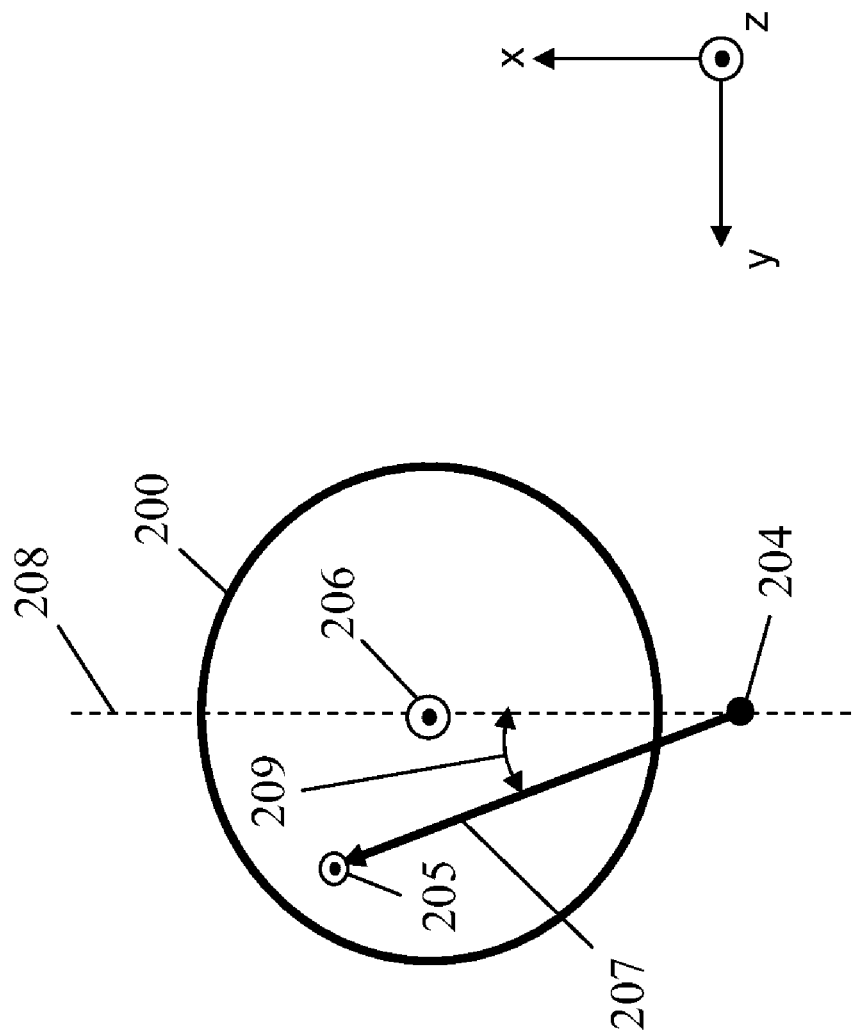
FIG. 2 illustrates an electrical device receiving an input current and generating a current vector and a superposition vector perpendicular to a sensing plane, as viewed in the x-y plane.

The terms of equations (1) and (2) are further illustrated at FIG. 2. FIG. 2 shows a view of electrical device 200. Electrical device 200 is directly analogous to electrical device 100 shown at FIG. 1, rotated in accordance with the x-y-z axis shown at FIG. 2. FIG. 2 also illustrates point 204 lying within a sensing plane (not shown) having dimension in the x-y axes only, analogous to sensing plane 103. A current vector 205 and a superposition vector 206 are illustrated having a direction parallel to the z-axis and coming out of the page. Position vector 207 extends from point 204 to the intersection of current vector 205 with the sensing plane, and reference axis 208 lies in the sensing plane, and passes through point 204. With respect to equations (1) and (2), d is the magnitude of position vector 207, and $\Theta$ is the angle 209 between position vector 207 and reference axis 208.

By using equations (1) and (2) when values of $B_x$, $B_y$, $l_n$, $m_x$, $m_y$, a, and b are known, it is possible to determine values for $\Theta$ and d, and determine the location where current vector 205 intersects the sensing plane with respect to point 204. Inverting equations (1) and (2) will provide two solutions about point 204 for the intersection of current vector 205 and the sensing plane. The correct solution for the situation illustrated at FIG. 2 can be determined by selecting the solution which places current vector 205 within the physical bounds of electrical device 200.

Figure 8:
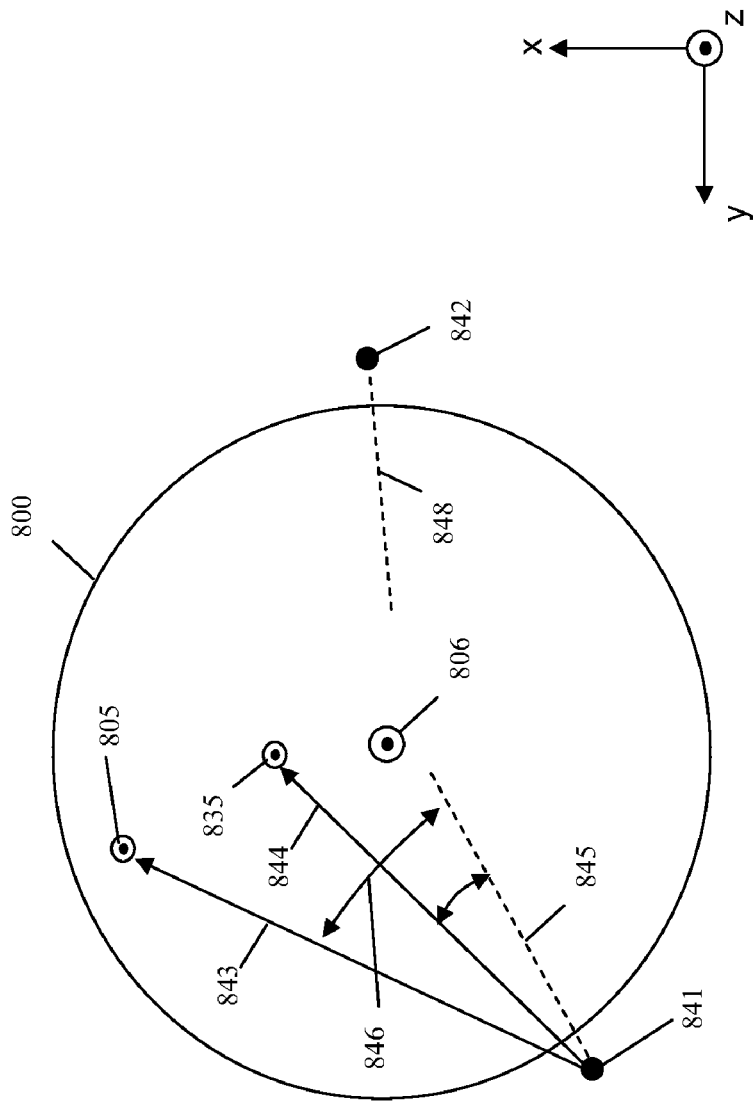
FIG. 8 illustrates an electric current locator having a plurality of magnetic field sensors.

When the values of $m_x$, $m_y$, a, and b are known, the principle may be extended for locating multiple current vectors, where the multiple current vectors each have a direction parallel to or coincident with current vector 205 and the multiple current vectors have a total summation current equal to $l_n$. This is further illustrated at FIG. 8. FIG. 8 shows a view of electrical device 800. Electrical device 800 is directly analogous to electrical device 100 shown at FIG. 1, rotated in accordance with the x-y-z axis shown at FIG. 8. FIG. 8 illustrates points 841 and 842 lying within a sensing plane (not shown) having dimension in the x-y axes only, analogous to sensing plane 103. Current vectors 805 and 835, and a superposition vector 806, are illustrated having a direction parallel to the z-axis and coming out of the page. Position vector 843 and position vector 844 extend from point 841 to the intersection of current vectors 805 and 835 with the sensing plane. Reference axis 845 lies in the sensing plane and passes through point 841. Subtending angle 846 and subtending angle 847 lie between reference axis 845 and position vector 843 and position vector 844 respectively.

Biot-Savart equations describing $B_x$ and $B_y$ at, for example, point 841 can be expressed as:

$$B_x = m_x l_n \left[ \sum_{i=1}^{n} (j_i \sin\Theta_i / d_i) - a \right],$$

$$B_y = m_y l_n \left[ \sum_{i=1}^{n} (j_i \cos\Theta_i / d_i) - b \right],$$

where $m_x$, $m_y$, a, and b are mathematical constants specific to point 841. The summation is conducted over the quantity n of current vectors, and j, is the fraction of the total current $l_n$ carried by the $i^{th}$ current vector. $\Theta_i$ is the angle between the reference axis 845 and a position vector from point 841 to the $i^{th}$ current vector, for example, subtending angle 846 when the $i^{th}$ current vector is current vector 805. The equations may be further simplified by assuming that current vectors 805 and 835 represent equivalent fractions of the total current $l_n$, giving equations (3) and (4):

$$B_x = m_x l_n \left[ \sum_{i=1}^{n} (\sin\Theta_i / (nd_i)) - a \right], \quad (3)$$

$$B_y = m_y l_n \left[ \sum_{i=1}^{n} (\cos\Theta_i / (nd_i)) - b \right], \quad (4)$$

Written only with respect to point 841 and describing current vectors 805 and 835, and formulated with knowledge of $B_x$, $B_y$, $m_x$, $m_y$, a, and b at point 841, equations (3) and (4) are insufficient to determine the values of $\Theta_i$ and $d_i$ and thereby determine the locations of current vectors 805 and 835, since such a formulation would provide 2 equations with 4 unknowns. However, knowledge of $B_x$, $B_y$, $m_x$, $m_y$, a, and b at a second point, for example point 842, allows formulation of equations (3) and (4) with respect to point 842 and reference axis 848. Because the location of point 841 and point 842 are known with respect to each other, and because reference axes 845 and 848 are geometrically defined, the $\Theta_i$ and $d_i$ terms describing a given current vector in both formulations can be related through a common geometric reference. As a result, for the situation illustrated at FIG. 8, when $B_x$, $B_y$, $M_x$, $m_y$, a, and b are known at both point 841 and point 842, equations (3) and (4) can be formulated at both point 841 and point 842 to produce 4 equations and 4 unknowns, and the locations of current vectors 805 and 835 may be determined with respect to the common geometric reference.

The methodology described above may be applied to determine the location of any number of current vectors of equal current magnitude passing through the sensing plane, provided that an at least equal number of locations points are present and that $B_x$, $B_y$, $m_x$, $m_y$, a, and b at each of the locations points is known.

The novel apparatus of this disclosure utilizes the principle that $B_x$ and $B_y$, arising from current flow 102 and as represented in equations (1) and (2), may be considered as arising from one or more current vectors, such as current vector 105 or current vectors 805 and 835, and a superposition vector, such as superposition vector 106 or superposition vector 806, where the one or more current vectors and the superposition vector have an orientation substantially perpendicular to the sensing plane. The novel apparatus utilizes determined values for the mathematical constants $m_x$, $m_y$, a, and b determined at each sensing location and inverts equations (3) and (4) to localize the one or more current vectors within an electrical device. As discussed supra, the values of $m_x$, $m_y$, a, and b are dependent on the location of the superposition vector 106, the electromagnetic nature of electrical device 100, and the relationship between input current 101 and the total current $l_n$. In the novel approach disclosed herein, an apparatus senses the components $B_x$ and $B_y$ at one or more sensing locations in a sensing plane and localizes one or more current vectors using determined values of the mathematical constants $m_x$, $m_y$, a, and b at the one or more sensing locations, where the number of sensing locations is at least equal to the number of current vectors localized.

The mathematical constants $m_x$, $m_y$, a, and b may be determined through mathematical regression. For example, referencing FIG. 1, the regression can be conducted by determining the values of $B_x$ and $B_y$ at point 104 which arise for a plurality of current vector 105 locations described by $\Theta$ and d, where the magnitude of current vector 105 relative to input current 101 is maintained substantially constant at each location in the plurality of locations. Determining these values for the plurality of locations will yield a plurality of data points, each having a respective value for $B_x$, $B_y$, $\Theta$, and d. Selecting a value for $l_n$ and fitting these data points to equations (1) and (2) then allows a determination of the $m_x$, $m_y$, a, and b values at point 104 for the given magnitude ratio between the input current and current vector 105. Having determined the $m_x$, $m_y$, a, and b values at point 104, equations (1) and (2) may then be utilized as continuous expressions relating $B_x$ and $B_y$ at point 104 to the location of current vector 105, as described by $\Theta_i$ and $d_i$, provided the magnitude of current vector 105 relative to input current 101 substantially matches the magnitude ratio utilized to generate the calibration points. Further, the same methodology may be conducted to determine the $m_x$, $m_y$, a, and b values at multiple sensing points, such as points 841 and 842. When multiple sensing points are utilized, the $m_x$, $m_y$, a, and b values determined for a single current vector may be utilized to determine the location of a quantity of current vectors by using the same $m_x$, $m_y$, a, and b values in equations (3) and (4), provided that the quantity of sensing points at least equals the quantity of current vectors, and further provided that the total current magnitude of the quantity of current vectors relative to electrical device input current substantially matches the magnitude ratio utilized to generate the calibration points using the single current vector. Under those conditions, the $m_x$, $m_y$, a, and b values determined at multiple sensing points for a single current vector may be utilized to determine the location of a quantity of current vectors, as described by $\Theta_i$ and $d_i$ in equations (3) and (4).

In the novel apparatus described herein, a processor receives inputs representing $B_x$ and $B_y$ as expressed in equations (3) and (4) from one or more magnetic field sensors, and localizes one or more current vectors by solving equations (3) and (4) for the location parameters $\Theta_i$ and $d_i$, where the total current magnitude of the one or more current vectors within the electrical device is known based on the magnitude of the input current received by the electrical device, and where the quantity of magnetic field sensors at least equals the number of current vector locations. An exemplary electrical device for the apparatus is an arc furnace, where a given amount of input power would be expected to produce a quantity of current arcs across the electrode gap, and where the total current magnitude of the current arcs can be related to the given amount of input power.

As stated, in order to conduct the mathematical regression and determine the mathematical constants $m_x$, $m_y$, a, and b for a given electrical device and a given magnitude ratio between an input current and the current vector to be located, a set of $B_x$, $B_y$, $\Theta$, and d data points must be generated. One exemplary method of generating the $B_x$, $B_y$, $\Theta$, and d data points utilizes finite element analysis of the electrical device. As an example, consider electrical device 300 shown at FIG. 3. Electrical device 300 receives input current 301 and generates current passing perpendicularly through sensing plane 303. Point 304 is a known location in sensing plane 303. In the situation illustrated at FIG. 3, the $B_x$, $B_y$, $\Theta$, and d data for determination of the mathematical constants $m_x$, $m_y$, a, and b for a certain ratio of input current 301 to a current vector to be sensed may be generated by dividing electrical device 300 into a finite element network which further includes point 304. The properties of the finite element network may be manipulated such that when input current 301 is applied, a current vector of known magnitude passes perpendicularly through sensing plane 303 at a sensing point, where the sensing point is located on sensing plane 303 and within an electrical device boundary, where the electrical device boundary is the intersection of electrical device 300 and sensing plane 303. For example, the finite element network may be manipulated such that current vector 305 passes through sensing point 312 when input current 301 is supplied. The finite element analysis can then provide the resulting $B_x$ and $B_y$ at point 304 when input current 301 is supplied and current vector 305 passes through sensing point 312, as illustrated at FIG. 3. Similarly, the finite element network may be manipulated such that when the same input current 301 is supplied, current vector 305 passes through sensing point 313, and $B_x$ and $B_y$ at point 304 when current vector 305 passes through sensing point 313 can be determined. Similar finite element network manipulation could be conducted so that current vector 305 passes through sensing point 314 in response to input current 301. If such an analysis is conducted and $B_x$, $B_y$, $\Theta$, and d data is available for the three sensing points 312, 313, and 314, then the $B_x$, $B_y$, $\Theta$, and d data may be mapped to equations (1) and (2) in order to determine suitable values for the mathematical constants $m_x$, $m_y$, a, and b at point 304. Suitable values for the mathematical constants $m_x$, $m_y$, a, and b at additional points, for example point 349, may be determined similarly.

Within this methodology, as discussed supra, the magnetic field arising at a certain point in response to input current supplied to an electrical device is equated to a magnetic field arising from a current vector and a superposition vector. As a result, the superposition vector represents the response of an electrical device when the current vector occurs at a certain location on a sensing plane. For example, referring to FIG. 1, when input current 101 is supplied to electrical device 100 and current vector 105 passes through sensing plane 103 at the location shown, superposition vector 106 represents the response of the electrical device 100 to the current vector 105 at that location. It is understood, therefore, that manipulation of a finite element network in order to generate data for determination of the mathematical constants $m_x$, $m_y$, a, and b is most effective when the manipulation reflects realistic operating points for the electrical device. For example, if the electrical device 100 is an arc furnace, current vector 105 is a singular arc bridging the arc furnace electrode gap, and the sensing plane 103 passes through the electrode gap, it would be most effective to manipulate the properties of the air gap in order to force the singular arc across the gap at a desired location, rather than the physical properties of the electrode itself, or some other component that provides a relatively strong contribution to the magnetic field in the sensing plane. Manipulation of the physical properties of the electrode itself rather than the air gap properties would have a much larger impact on the resulting $B_x$ and $B_y$ values simulated, and would have a corresponding impact on the accuracy of any resulting mathematical constants $m_x$, $m_y$, a, and b determined.

It is further understood that the validity of the mathematical constants $m_1$, $m_2$, a and b determined is dependent on the relative magnitude of input current 101 and current vector 105. Those skilled in the art understand that if the mathematical constants are determined for a given scaling factor, where the scaling factor is equal to the magnitude of current vector 105 divided by the magnitude of input current 101, then the mathematical constants $m_x$, $m_y$, a and b describe current vector 105 location most accurately when electrical device 100 operates with a substantially equivalent scaling factor.

Alternatively, another method of generating data points for determination of the mathematical constants $m_x$, $m_y$, a, and b is through physical manipulation and measurement of the electrical device. For example, the electrical device may have well defined current paths through the sensing plane as defined by a circuit schematic, such as electrical device 400 illustrated at FIG. 4. Electrical device 400 receives input current 401 and is designed to operate in accordance with schematic 410. Schematic 410 is comprised of electrical components, such as electrical component 411, and provides well defined paths where the schematic 410 currents intersect sensing plane 403, shown as sensing point 412, sensing point 413, and sensing point 414. Magnetic field sensor 415 is positioned at point 404 and oriented to sense $B_x$ and $B_y$ in sensing plane 403. In the situation illustrated at FIG. 4, the $B_x$, $B_y$, $\Theta$, and d data for determination of the mathematical constants $m_x$, $m_y$, a, and b for a certain ratio of input current 401 to the current vector to be sensed could be generated by physical manipulation of electrical component 411 or other electrical components in schematic 410, such that when input current 401 is applied, a current vector of known magnitude results through one of the sensing points 412, 413, or 414, and magnetic field sensor 415 provides the resulting $B_x$ and $B_y$. Conducting the evaluation over the plurality of sensing points 412, 413, and 414 provides $B_x$, $B_y$, $\Theta$, and d data which may be mapped to equations (1) and (2) in order to determine suitable values for the mathematical constants $m_x$, $m_y$, a, and b. Note also that this methodology is not restricted to electrical devices having well defined and pre-determined current paths through the sensing plane, as illustrated at FIG. 4. The same methodology could be employed in, for example, an arc furnace, where the current vector represents the arc bridging the electrode gap and intersecting the sensing plane at the electrode gap. In such an application, the location of the arc might not be predictable, however physical manipulation of the system, for example, shorting across the electrode gap at a plurality of locations, could provide sufficient $B_x$, $B_y$, $\Theta$, and d data such that the mathematical constants $m_x$, $m_y$, a, and b can be determined. Suitable values for the mathematical constants $m_x$, $m_y$, a, and b at additional points, for example point 449, may be determined similarly.

Additionally, it is understood that the validity of the mathematical constants $m_1$, $m_2$, a and b determined is dependent on a given scaling factor for input current 401 and current vector 405, where the scaling factor is equal to the magnitude of current vector 405 divided by the magnitude of input current 401, and that the mathematical constants $m_1$, $m_2$, a and b describe current vector 405 location most accurately when electrical device 400 operates with a substantially equivalent scaling factor.

The novel apparatus of this disclosure senses the magnetic field components $B_x$ and $B_y$ at one or more magnetic field sensors and utilizes equations (3) and (4) to describe the location of a quantity of current vectors in an electrical device receiving an input current. The novel apparatus utilizes the mathematical constants $m_x$, $m_y$, a, and b as determined for the electrical device and a specific ratio of the input current to the current vector sensed. The novel apparatus utilizes a mathematically continuous description of $B_x$ and $B_y$, such that at all points on the sensing plane within the electrical device can be described based on calibration data from a finite plurality of locations.

Description of the Apparatus

Figure 5:
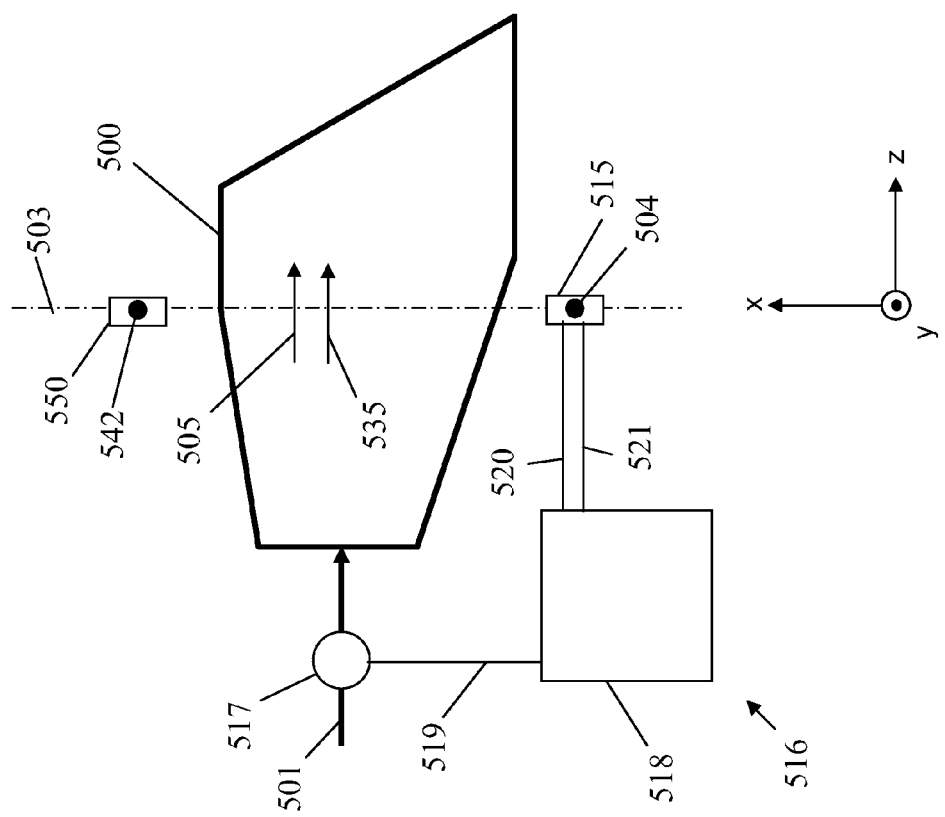
FIG. 5 illustrates an electric current locator operating on an electrical device.

The principles as discussed may be utilized in an apparatus such as the electric current locator 516 illustrated at FIG. 5. Electric current locator 516 is comprised of input current measurement device 517, one or more magnetic field sensors shown as magnetic field sensor 515 and magnetic field sensor 550, and processor 518. Electric current locator 516 is capable of determining a location where one or more current vectors, illustrated as current vector 505 and current vector 535, intersect sensing plane 503 in electric device 500 in response to input current 501. The quantity of current vectors localized by electric current locator 516 is limited by the quantity of magnetic field sensors, here illustrated as two, however electric current locator 516 may have any quantity of magnetic field sensors and may thus locate any quantity of current vectors.

The direction of current vectors 505 and 535 are known, and the electric current locator 516 species the point where current vectors 505 and 535 intersects sensing plane 503 by solving equations (3) and (4) for the quantities $\Theta_i$ and $d_i$, where $d_i$ is a position vector originating from either field sensing location 504 or field sensing location 542, and $\Theta_i$ is an angle between the position vector $d_i$ and a sensing reference axis passing through either field sensing location 504 or field sensing location 542.

Sensing plane 503 is not a physical construct, but rather represents a two-dimensional plane having a substantially perpendicular orientation with respect to the current vectors 505 and 535 to be sensed. As a result, the direction of current vectors 505 and 535 determine the orientation of sensing plane 503 and directly impacts other geometric parameters specified for electric current locator 516, as discussed infra. At FIG. 5, sensing plane 503 is a plane having dimension on the x-y axes only, and current vectors 505 and 535 have direction parallel to the z axis. Electric current locator 516 provides results assuming that current vector 505 and 535 are perpendicular to sensing plane 503, so deviations from the perpendicular impact the accuracy of electric current locator 516. The allowable deviation from the perpendicular for a given accuracy is dependent on the application utilizing electric current locator 516, as is understood in the art. Further, electric current locator 516 provides results assuming that current vector 505 and 535 geometrically intersect sensing plane 503. Those skilled in the art recognize that electric current locator 516 may be utilized to provide an indication of current vector 505 and 535 locations when current vectors 505 and 535 do not geometrically intersect sensing plane 503, but that the accuracy may be compromised. For example, as applied to an electric arc furnace, electric current locator 516 could be positioned with sensing plane 503 slightly above or below the electrode gap and still provide an indication of electric arc location within the gap, however optimal accuracy would be expected when sensing plane 503 passed through the electrode gap.

Similarly, field sensing locations 504 and 542 are not physical constructs, but rather points on sensing plane 503 where magnetic field sensors 515 and 550 are substantially located. Electric current locator 516 provides results assuming that a magnetic field sensed by magnetic field sensor 515 is occurring at field sensing locations 504 and 550, so the proximity of magnetic field sensor 515 and 550 to field sensing locations 504 and 550 respectively impacts the accuracy of electric current locator 516. The necessary degree of proximity for a given accuracy is dependent on the application utilizing electric current locator 516, as is understood in the art. Similarly, the sensing reference axis for a given field sensing location is not a physical construct, but rather is a line lying in the sensing plane and passing through the given field sensing location. The orientation of the sensing reference axis outside of these constraints is arbitrary for a given field sensing location, however once the orientation is determined, the sensing reference axis for the given field sensing location remains fixed during operation of electric current locator 516. In a preferred embodiment, the sensing reference axis is oriented such that expected values for $\Theta_i$ within equations (3) and (4) are less than approximately 60 degrees.

Current measurement device 517 determines at least the magnitude of input current 501 supplied to electric device 500. Additionally, current measurement device 517 has current signal output 519 for transmission of a signal representative of the magnitude of input current 501.

Magnetic field sensor 515 is a field sensor capable of measuring a magnetic field in a first direction and in a second direction, and is substantially located at field sensing location 504. Further, magnetic field sensor 515 is oriented with respect to sensing plane 503 such that the first direction and the second direction lay within the sensing plane. In a preferred embodiment, the first direction and the second direction are orthogonal. Additionally, magnetic field sensor 515 has first output 520 for transmission of a signal representative of the magnitude of the magnetic field sensed in the first direction, and magnetic field sensor 515 has second output 521 for transmission of a signal representative of the magnitude of the magnetic field sensed in the second direction. Similarly Magnetic field sensor 550 is a field sensor capable of measuring a magnetic field in a first direction and in a second direction, and is substantially located at field sensing location 542. It is not necessary that the first direction of magnetic field sensor 550 correspond to the first direction of magnetic field sensor 515, or that the second direction of magnetic field sensor 550 correspond to the second direction of magnetic field sensor 515. Further, magnetic field sensor 550 is oriented with respect to sensing plane 503 such that the first direction and the second direction lay within the sensing plane. In a preferred embodiment, the first direction and the second direction are orthogonal. Additionally, magnetic field sensor 550 has first output (not shown) for transmission of a signal representative of the magnitude of the magnetic field sensed in the first direction, and magnetic field sensor 550 has second output (not shown) for transmission of a signal representative of the magnitude of the magnetic field sensed in the second direction Processor 518 is a computing device in data communication with current measurement device 517, magnetic field sensor 515, and magnetic field sensor 550. Processor 518 receives current signal output 519 from current measurement device 517, and receives first outputs and second outputs from magnetic field sensors 515 and 550. Processor 518 formulates, for both magnetic field sensors 515 and 550, Biot-Savart superposition equations having the form, $$B_1 = m_1 l \left[ \left( \sum_{i=1}^{n} \sin\Theta_{Mi} / (n d_{Mi}) \right) - a \right],$$

$$B_2 = m_2 l \left[ \left( \sum_{i=1}^{n} \cos\Theta_{Mi} / (n d_{Mi}) \right) - b \right],$$

where n=the quantity of current vectors to be localized, illustrated as two at FIG. 5, $B_1$ is the first output from magnetic field sensors 515 or magnetic field sensor 550, $B_2$ is the second output from the magnetic field sensor providing $B_1$, l is the combined total current of the two current vectors 505 and 535, as determined based on the current signal output 519.

$d_{Mi}$ is an unknown variable representing the length of a sensing point vector originating at the field sensing location of the magnetic field sensor providing $B_1$ and terminating where the $i^{th}$ current vector intersects the sensing plane, where the $i^{th}$ current vector is either current vector 505 or current vector 535, $\Theta_{Mi}$ is an unknown variable representing an angle between $d_{Mi}$ and the sensing reference axis for the magnetic field sensor providing $B_1$, and $m_1$, $m_2$, a and b are mathematical constants specific to electrical device 500 and specific to the magnetic field sensor providing $B_1$, as determined through a procedure generating calibration data.

Processor 518 is further capable of expressing all $\Theta_{Mi}$ and $d_{Mi}$ referenced to a common point based on the relative locations of field sensing locations 542 and 504, of all individual sensing locations, such that processor 518 receives data from magnetic field sensors 515 and 540 and produces a set of formulated equations having a quantity of equations at least equal to a quantity of unknowns. For the situation illustrated at FIG. 5, processor 518 utilizes the Biot-Savart superposition equations to produce four equations with four unknowns. Processor 518 then simultaneously solves the formulated equations to describe the location of each current vector in the quantity of current vectors based on the resulting values of $\Theta_{Mi}$ and $d_{Mi}$. In this manner, as illustrated at FIG. 5, processor 518 provides location data for current vectors 505 and 535. When additional magnetic field sensors are employed such that an increased quantity of current vectors may be localized, processor 518 is in similar data communication with all the magnetic field sensors, and processor 518 operates similarly to provide location data for each current vector in the increased quantity of current vectors.

As discussed, the mathematical constants $m_1$, $m_2$, a and b specific to each magnetic field sensor may be determined by physical measurement of the magnetic field at field sensing locations 504 and 542 when input current 501 is supplied and a current vector having a magnitude equal to the combined current of the quantity of current vectors—represented by current vectors 505 and 535 at FIG. 5—is present in electrical device 500 at known locations described by $\Theta_M$ and $d_M$. Alternatively, the mathematical constants $m_1$, $m_2$, a and b specific to each magnetic field sensor may be determined using finite element analysis of electrical device 500, by simulating input current 501 into the finite element network, manipulating the finite element network such a current vector having a magnitude equal to the combined current of the quantity of current vectors passes through sensing plane 503 at known locations, and determining the magnitude of the magnetic field at field sensing locations 504 and 542. The determined values of $m_1$, $m_2$, a and b specific to each magnetic field sensor are then utilized by processor 518 to provide location data for a quantity of current vectors. For the arrangement illustrated at FIG. 5, processor 518 could provide locations data for up to two current vectors, such as current vectors 505 and 535, provided that the relative magnitude of the combined total current of current vectors 505 and 535 as compared to the input current 501 producing those current vectors is substantially equivalent to the relative magnitude between the single current vector utilized in the calibration and the input current which produced that single current vector.

Detailed Description of an Embodiment

Figure 6:
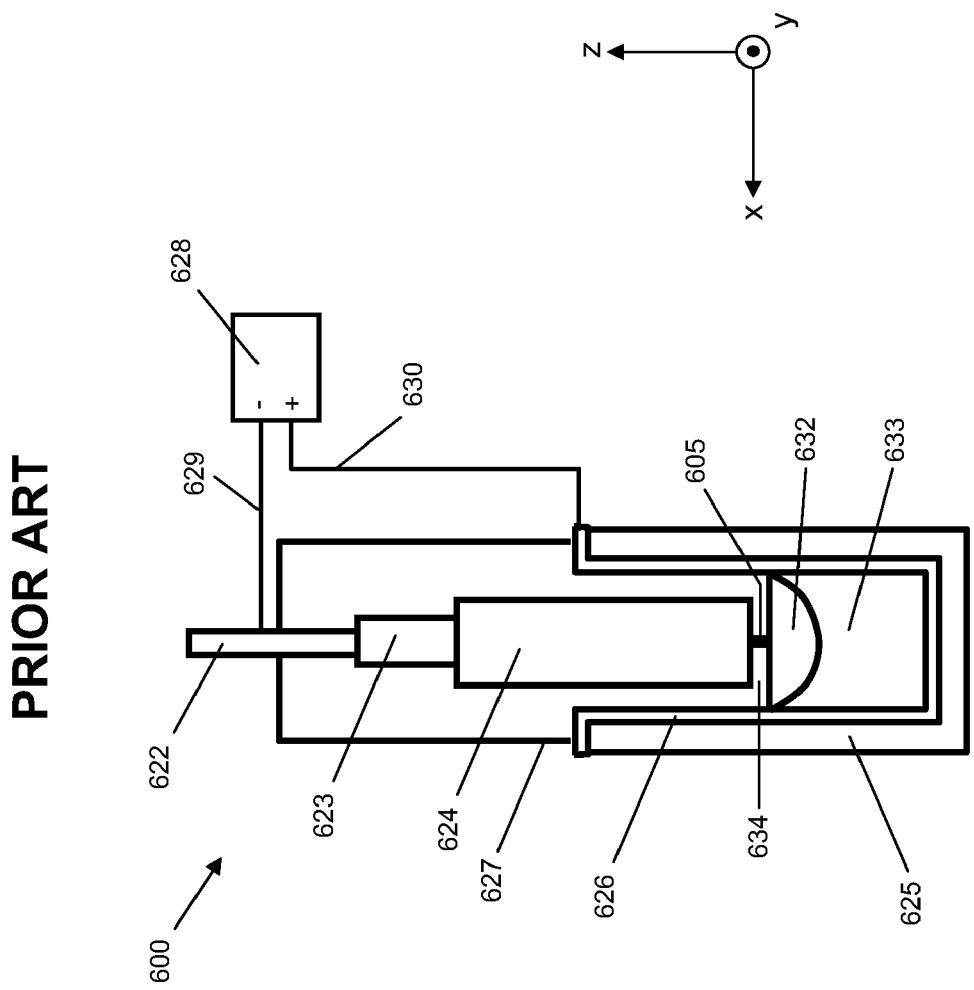
FIG. 6 illustrates the components of an arc furnace.

The apparatus disclosed has been applied to the location of an electric arc in a Vacuum Arc Furnace (VAR). A schematic of VAR 600 is shown at FIG. 6. VAR 600 has ram 622 which translates in a direction parallel to the z axis of the x-y-z axis shown. Ram 622 is connected to stinger 623. Stinger 623 is typically an expendable connection threadably engaged to electrode 624. Electrode 624 is comprised of the material to be melted in the VAR, and is consumed during the process. Electrode 624 extends into copper crucible 626, which is maintained in place by water-cooled jacket 625. Vacuum enclosure 627 provides a mechanical feed through to ram 622 and acts in conjunction with crucible 626 to provide a vacuum environment within the enclosure formed by crucible 626 and vacuum enclosure 627.

In operation, power supply 628 is connected to ram 622 and copper crucible 626. Current driven by power supply 628 passes through ram 622, stinger 623, and electrode 624, and produces a quantity of electric arcs 605 bridging electrode gap 634, between electrode 624 and molten pool 632. Molten pool 632 and solid ingot 633 are comprised of material from electrode 624 melted by the action of the quantity of electric arcs 605. During the melting, the level of molten pool 632 and solid ingot 633 increases, and ram 622 is adjusted to maintain electrode gap 634.

The location of the quantity of electric arcs 605 in electrode gap 634 during the melting process has significant importance. Because the quantity of electric arcs 605 is the primary source of heat in VAR 600, an even distribution of arc positions versus time can minimize any propensity toward defect formation in solid ingot 633. The ideal arc condition is that of diffuse arcs, achieved when the quantity of electric arcs 605 distributes evenly across electrode 624 surface on a time-averaged basis. However, assessing a diffuse arc condition is difficult during VAR 600 operation, because the quantity of electric arcs 605 is not visible. As a result, a real-time non-invasive measurement system that can provide a location of the quantity of electric arcs 605 during operation would be of great value. The novel apparatus described herein may be utilized in this capacity, such that the quantity of electric arcs 605 may be located in real time, and the operating parameters of VAR 600 may be adjusted in response to maintain the diffuse arc condition.

Figure 7:
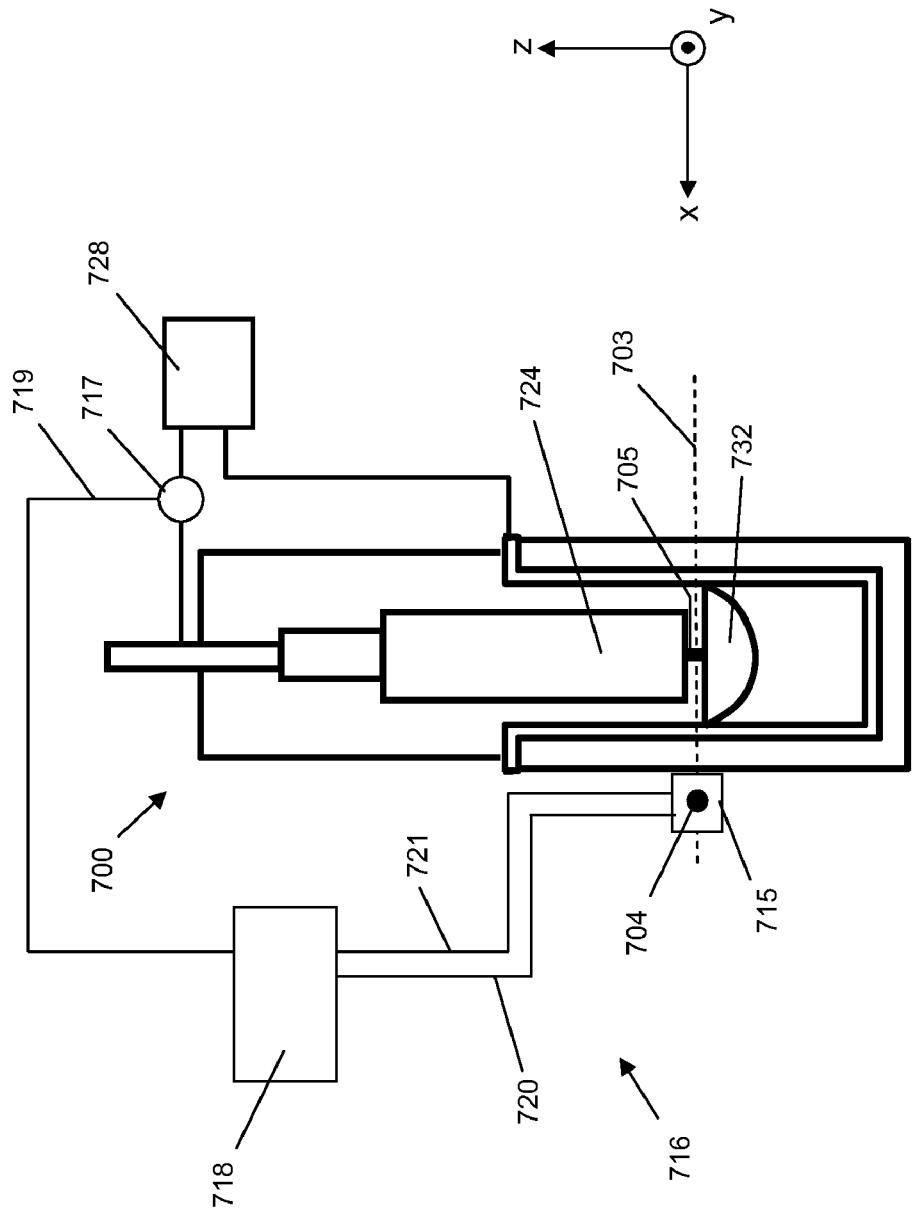
FIG. 7 illustrates an electric current locator operating on an arc furnace.

FIG. 7 illustrates the novel apparatus described herein operating on VAR 700. VAR 700 is operating such that electric arc 705 bridges the electrode gap between the electrode 724 and molten pool 732 in response to power from power supply 728. Sensing plane 703 has dimension on the x and y axes of the x-y-z axis shown, and extends between electrode 724 and molten pool 732 as illustrated. Field sensing location 704 is located on sensing plane 703.

In the particular embodiment shown, power supply 728 provides DC power up to 30,000 Amps and 100 Volts. In a typical operation of VAR 700, power supply 728 supplies 1200-4000 Amps at 20-30 Volts.

Electric current locator 716 includes current measurement device 717. Current measurement device 717 determines at least the magnitude of current supplied from power supply 728, and current measurement device 717 has current signal output 719 for transmission of a signal representative of the magnitude of current supplied from power supply 728.

Electric current locator 716 further includes magnetic field sensor 715. Magnetic field sensor 715 is a multi-axis Hall Effect sensor located at field sensing location 704 and oriented to detect magnetic fields in the x direction and y direction in sensing plane 703. Magnetic field sensor 715 has first output 720 for transmission of a signal representative of the magnitude of the magnetic field sensed in the x direction, and magnetic field sensor 715 has second output 721 for transmission of a signal representative of the magnitude of the magnetic field sensed in the y direction. It is preferable that field sensing location 704 be located at a point where the gradient of the magnetic flux in the x and y direction is minimal over the respective dimensions of magnetic field sensor 715. Additionally, because magnetic field sensor 715 responds to magnetic fields arising from all sources, it is advantageous if field sensing location 704 has a close proximity to VAR 700, so that the influence of magnetic fields arising from background sources may be minimized. Once placed at field sensing location 704, magnetic field sensor 715 is electronically zeroed with respect to magnetic fields arising outside of VAR 700 operation, such as the earth's magnetic field or other background magnetic fields expected in the VAR 700 operating environment.

Electric current locator 716 further includes processor 718. Processor 718 is a computing device which receives first output 720 and second output 721 from magnetic field sensor 715, and current signal output 719 from current measurement device 717. Processor 718 solves Biot-Savart superposition equations having the form of equations (3) and (4) discussed infra in order to determine $\Theta_i$ and $d_i$ and describe the location of electric arc 705 with respect to field sensing location 704. In the particular embodiment shown, processor 718 is a data acquisition system and a computer, where the data acquisition system is a NATIONAL INSTRUMENTS data acquisition system capable of digitizing 32 analog inputs and having a maximum 100 MHz transfer rate from the inputs to the computer.

As discussed infra, the use of the electric current locator requires that the relative magnitudes of an input current and a current vector to be localized be known. With respect to electric current locator 716, the input current arises from power supply 728 and is indicated by current measurement device 717. The current vector to be localized is electric arc 705. With regard to VAR 700, the relative magnitude of the input current indicated by current measurement device 717 and the current through electric arc 705 is assumed as a constant value.

In a particular embodiment, the mathematical constants $m_1$, $m_2$, a and b of equations (3) and (4) were determined by finite element analysis of VAR 700 using a finite element software package, such as COMSOL MULTIPHYSICS. In the particular embodiment, the geometry of VAR 700 and electric current locator 716 was drawn with sensing plane 703 passing through the electrode gap. The entire model was meshed to create discrete finite elements, with a finer mesh region in sensing plane 703. An even finer mesh was utilized for magnetic field sensor 715.

The finite element analysis was conducted for a plurality of electric arc 705 locations in sensing plane 703 in order to determine expected values for the magnetic field sensed by magnetic field sensor 715 in the x and y directions. Each location in the plurality of electric arc 705 locations was described by the terms $\Theta$ and d with respect to field sensing location 704. An input current from power supply 728 was simulated, the magnitude of the current passing through electric arc 705 was determined based on the input current, and the finite element network was manipulated to force electric arc 705 through each location in the plurality of locations. In a preferred environment, the finite element network was manipulated by modeling extremely low conductivity in the electrode gap surrounding a desired location of electric arc 705, so that substantially all current in electrode 724 was forced through that desired location of electric arc 705 at the electrode gap. Seven discrete locations for electric arc 705 were simulated, and simulated magnetic field measurements in the x and y directions at field sensing location 704 were determined. Regression was conducted on the data to determine the resulting mathematical constants $m_1$, $m_2$, a and b for equations (3) and (4).

In another embodiment, the mathematical constants $m_1$, $m_2$, a and b of equations (3) and (4) were determined by physical manipulation of VAR 700 and measurement of the resulting magnetic fields at field sensing location 704. In this particular embodiment, a physical short was placed within the electrode gap at a plurality of locations, operating current was supplied to VAR 700, and the resulting magnetic field in the x direction and y direction was measured by magnetic field sensor 715. Regression was then conducted on the recorded data to determine the resulting mathematical constants $m_1$, $m_2$, a and b for equations (3) and (4).

Having determined the mathematical constants $m_1$, $m_2$, a and b, electric current locator 716 can be utilized to provide, a real-time non-invasive measurement for location of electric arc 705 during VAR 700 operation. In this manner, the distribution of electric arc 705 on a time-averaged basis may be determined, and the operating parameters of VAR 700 may be adjusted in response to maintain a diffuse arc condition.

As discussed supra, it is understood that the validity of the mathematical constants $m_1$, $m_2$, a and b determined is dependent on the relative magnitude of the input current and the current vector to be sensed by electric current locator 716.

Those skilled in the art understand that if the mathematical constants are determined for a given scaling factor, where the scaling factor is the magnitude of the current vector divided by the magnitude of the input current, then electric current locator 716 will operate most accurately when the current sensed by current measurement device 717 and the current through electric arc 705 substantially express the same given scaling factor, and that accuracy can be expected to degrade as deviations away from the given scaling factor increase. Further, it is understood that the same concept applies for all electrical devices analyzed by the electrical current locator described herein.

Further, as discussed supra, it is understood that additional magnetic field sensors may be utilized around VAR 700, and that the mathematical constants $m_1$, $m_2$, a and b may be determined for each of the magnetic field sensors as discussed herein, so that electric current locator 716 may provide location data for a quantity of current vectors in VAR 700. For example, rather than modeling electric arc 705 as a single arc, it may be preferable to model the arcing across the electrode gap as being comprised of four separate arcs, and determine the location of those four separate arcs using an electric current locator 716 having at least four magnetic sensors. The electric current locator 716 may be utilized to localize any quantity of arcs across the electrode gap of VAR 700, provided that the quantity of magnetic field sensors is at least equal to the quantity of arcs localized.

Thus, the disclosure herein provides an electric current locator whereby an exact solution for the location of a quantity of current vectors in an electrical device can be determined directly from remotely sensed magnetic field parameters.

Further, the disclosure herein provides an electric current locator whereby the exact solution for the location of the quantity of current vectors does not rely on restriction of the current vector to well defined current paths within the electrical device.

Further, the disclosure herein provides an electric current locator whereby the exact solution for the location of the quantity of current vectors may be determined in an electrical device that experiences poorly defined current patterns over the course of normal operation.

Further, the disclosure herein provides an electric current locator whereby a sensed magnetic field may be interpreted in a mathematically continuous way, so that a remotely sensed parameter may serve to locate a quantity of current vectors with precision within an electrical device.

Having described the basic concept of the invention, it will be apparent to those skilled in the art that the foregoing detailed disclosure is intended to be presented by way of example only, and is not limiting. Various alterations, improvements, and modifications are intended to be suggested and are within the scope and spirit of the present invention. Additionally, the recited order of elements or sequences, or the use of numbers, letters, or other designations therefore, is not intended to limit the claimed processes to any order except as may be specified in the claims. Accordingly, the invention is limited only by the following claims and equivalents thereto.

All publications and patent documents cited in this application are incorporated by reference in their entirety for purposes to the same extent as if each individual publication or patent document were so individually denoted.

What is claimed is:

1. An apparatus for localizing a quantity of current vectors in an electrical device, where the electrical device produces a magnetostatic field in response to an input current and the quantity of current vectors is a known quantity equal to one or more, and where each current vector in the quantity of current vectors has a current direction, where the current direction is known and the current direction is the same among all current vectors in the quantity of current vectors, and where a total current is known, where the total current is the sum of all currents in the quantity of current vectors, comprising:

an input current measurement device capable of measuring the input current, the input current measurement device having a current signal output for transmission of a signal representative of the magnitude of the input current;

one or more magnetic field sensors, where the quantity of the one or more magnetic field sensors is equal to or greater than the quantity of current vectors, where each individual sensor in the one or more magnetic field sensors has a first output and a second output, and where the each individual sensor is capable of sensing a magnitude of the magnetostatic field in a first direction and transmitting a signal representative of the magnitude of the magnetostatic field in the first direction through the first output, and where the each individual sensor is capable of sensing a magnitude of the magnetostatic field in a second direction and transmitting a signal representative of the magnitude of the magnetostatic field in the second direction through the second output, and where the each individual sensor is mounted at an individual field sensing location located in a sensing plane, where the sensing plane is a geometric plane having a substantially perpendicular orientation with respect to the current direction, and where the each individual sensor is mounted on an individual sensing reference axis, where the individual sensing reference axis is a line lying in the sensing plane and passing through the individual field sensing location, and where the each individual sensor is oriented such that the first direction and the second direction both lie in the sensing plane, such that a quantity of individual field sensing locations exist, where the quantity of individual field sensing locations is equal to the quantity of the one or more magnetic field sensors, and each individual field sensing location in the quantity of individual field sensing locations is unique from any other individual field sensing location in the quantity of individual field sensing locations; and a processor in data communication with the input current measurement device and receiving the current signal output, and the processor in data communication with the each individual sensor and receiving the first output and the second output from the each individual sensor, and the processor capable of formulating, for the each individual sensor, Biot-Savart superposition equations having the form, $$B_1 = m_1 l \left[ \left( \sum_{i=1}^{n} (\sin\Theta_{Mi} / (nd_{Mi})) \right) - a \right],$$

$$B_2 = m_2 l \left[ \left( \sum_{i=1}^{n} (\cos\Theta_{Mi} / (nd_{Mi})) \right) - b \right],$$

where
n=the quantity of current vectors,
$B_1$ is the first output from the each individual sensor,
$B_2$ is the second output from the each individual sensor,
l is the total current, $\Theta_{Mi}$ is an unknown variable representing an angle between the sensing reference axis for the each individual sensor and an ith sensing point vector, where the ith sensing point vector originates at the individual field sensing location for the each individual sensor and terminates at an unknown point where the ith current vector in the quantity of current vectors intersects the sensing plane, $d_{Mi}$ is an unknown variable representing the length of the ith sensing point vector, and $m_1$, $m_2$, a and b are mathematical constants specific to the electrical device and the input current and determined through a procedure generating calibration data, and the processor capable of expressing all $\Theta_{Mi}$ and $d_{Mi}$ referenced to a common point based on the relative locations of all individual sensing locations, such that the processor receives data from all of the each individual sensors and produces a set of formulated equations, and the set of formulated equations has a quantity of equations at least equal to a quantity of unknowns in the set of formulated equations, and the processor capable of simultaneously solving the set of formulated equations and determining a location for each current vector in the quantity of current vectors relative to the common point, thereby localizing the quantity of current vectors in the electrical device, where the electrical device produces a magnetostatic field in response to an input current and the quantity of current vectors is a known quantity equal to one or more.

2. The apparatus of claim 1 where the procedure generating calibration data to determine $m_1$, $m_2$, a and b specific to the electrical device is comprised of:

determining a scaling factor, where the scaling factor is equal to the total current divided by the magnitude of the input current; and determining $m_1$, $m_2$, a and b for each individual field sensing location in the quantity of individual field sensing locations by, establishing a finite element network describing the electrical device and manipulating the finite element network such that when a simulated input current is supplied, a simulated current vector passes through the sensing plane at a current location point, where the simulated current vector has a direction equivalent to the current direction, and where the simulated current vector has a magnitude equal to the simulated input current times the scaling factor, where the current location point is located on the sensing plane and within an electrical device boundary, where the electrical device boundary is the intersection of the electrical device and the sensing plane, and where the current location point has a known location relative to the each individual field sensing location, conducting magnetic finite element analysis using the finite element network with the simulated input current and using the magnetic finite element analysis to determine a simulated individual magnetic field measurement at the each individual sensing location, where the simulated individual magnetic field measurement is a magnetic field vector lying in the sensing plane at the each individual sensing location, and where the magnetic field vector is expressed as a first component in the first direction of the each individual sensing location and a second component in the second direction of the each individual sensing location, generating a calibration datum point by correlating the current location point, the magnitude of the simulated current vector, and the simulated individual magnetic field measurement, generating calibration data, where the calibration data is a plurality of calibration datum points, by maintaining the value of the scaling factor and repeating the establishing a finite element network describing the electrical device and manipulating the finite element network step, the conducting magnetic finite element analysis using the finite element network step, and the generating a calibration datum point step for a plurality of current location points, mapping the calibration data to determine $m_1$, $m_2$, a and b for the each individual field sensing location using the Biot-Savart superposition equations having the form, $$B_x = m_1 l_{SIM}(\sin \Theta_{SIM}/d_{SIM} - a),$$

$$B_y = m_2 l_{SIM}(\cos \Theta_{SIM}/d_{SIM} - b), \text{where}$$

$B_x$ is the first component of a given simulated individual magnetic field measurement in the calibration data, $B_y$ is the second component of the given simulated individual magnetic field measurement in the calibration data, $l_{SIM}$ is the magnitude of the simulated current vector correlated with the given simulated individual magnetic field measurement in the calibration data, $\Theta_{SIM}$ is an angle between the sensing reference axis for the each individual field sensing location and a location point vector, where the location point vector originates at the each individual field sensing location and terminates at the current location point correlated with the given simulated individual magnetic field measurement in the calibration data, and $d_{SIM}$ is the length of the location point vector, such that $m_1$, $m_2$, a and b are determined and the Biot-Savart superposition equations fit the calibration data to within a desired level of agreement, thereby determining $m_1$, $m_2$, a and b for the each individual field sensing location, thereby generating calibration data to determine $m_1$, $m_2$, a and b specific to the electrical device.

3. The apparatus of claim 1 where the procedure generating calibration data to determine $m_1$, $m_2$, a and b specific to the electrical device is comprised of:

determining a scaling factor, where the scaling factor is equal to the magnitude of the total current divided by the magnitude of the input current; and determining $m_1$, $m_2$, a and b for each individual field sensing location in the quantity of individual field sensing locations by, providing a model input current to the electrical device and manipulating the electrical device such that a model current vector passes through the sensing plane at a current location point, where the model current vector has a direction equivalent to the current direction, and where the model current vector has a magnitude equal to the model input current times the scaling factor, where the current location point is located on the sensing plane and within an electrical device boundary, where the electrical device boundary is the intersection of the electrical device and the sensing plane, and where the current location point has a known location relative to the each individual field sensing location, measuring a model magnetic field measurement at the each individual field sensing location using the one or more magnetic field sensors at the each individual field sensing location, where the model magnetic field measurement is expressed as a first component in the first direction and a second component in the second direction;

generating a calibration datum point by correlating the current location point, the magnitude of the model current vector, and the model magnetic field measurement in calibration data;

generating calibration data, where the calibration data is a plurality of calibration datum points, by maintaining the value of the scaling factor and repeating the providing a model input current to the electrical device step, the measuring a model magnetic field measurement step, and the generating a calibration datum point step for a plurality of current location points, mapping the calibration data to determine $m_1$, $m_2$, a and b for the each individual field sensing location using the Biot-Savart superposition equations having the form, $$B_x = m_1 l_{MEAS}(\sin \Theta_{MEAS}/d_{MEAS} - a),$$

$$B_y = m_2 l_{MEAS}(\cos \Theta_{MEAS}/d_{MEAS} - b), \text{where}$$

$B_x$ is the first component of a given model magnetic field measurement in the calibration data, $B_y$ is the second component of the given model magnetic field measurement in the calibration data, $l_{MEAS}$ is the magnitude of the model current vector correlated with the given model magnetic field measurement in the calibration data, $\Theta_{MEAS}$ is an angle between the sensing reference axis for the each individual field sensing location and a location point vector, where the location point vector originates at the each individual field sensing location and terminates at the current location point correlated with the given model magnetic field measurement in the calibration data, and $d_{MEAS}$ is the length of the location point vector, such that $m_1$, $m_2$, a and b are determined and the Biot-Savart superposition equations fit the calibration data to within a desired level of agreement, thereby determining $m_1$, $m_2$, a and b for the each individual field sensing location, thereby generating calibration data to determine $m_1$, $m_2$, a and b specific to the electrical device.

4. The apparatus of claim 1 where each current vector in the quantity of current vectors has an equal magnitude.

5. The apparatus of claim 1 where the quantity of the one or more magnetic field sensors is equal to the quantity of current vectors.

6. The apparatus of claim 1 where the first direction of the each individual sensor and the second direction of the each individual sensor are orthogonal.

7. The apparatus of claim 1 where the input current has a frequency less than or equal to 60 hz.

8. The apparatus of claim 1, where the electrical device is an arc furnace having an electrode gap and operating with a one or more electric arcs across the electrode gap, where the quantity of current vectors is representative of the one or more electric arcs.

9. An apparatus for localizing a quantity of electric arcs in an arc furnace, where the arc furnace has an electrode gap and the quantity of electric arcs crosses the electrode gap, and where the arc furnace produces a magnetostatic field in response to an input current and the quantity of electric arcs is a known quantity equal to one or more, and where each electric arc in the quantity of electric arcs has a current direction, where the current direction is known and the current direction is the same among all electric arcs in the quantity of electric arcs, and where a total current is known, where the total current is the sum of all currents in the quantity of electric arcs, comprising:

an input current measurement device capable of measuring the input current, the input current measurement device having a current signal output for transmission of a signal representative of the magnitude of the input current;

one or more magnetic field sensors, where the quantity of the one or more magnetic field sensors is equal to or greater than the quantity of current vectors, where each individual sensor in the one or more magnetic field sensors has a first output and a second output, and where the each individual sensor is capable of sensing a magnitude of the magnetostatic field in a first direction and transmitting a signal representative of the magnitude of the magnetostatic field in the first direction through the first output, and where the each individual sensor is capable of sensing a magnitude of the magnetostatic field in a second direction and transmitting a signal representative of the magnitude of the magnetostatic field in the second direction through the second output, and where the each individual sensor is mounted at an individual field sensing location located in a sensing plane, where the sensing plane is a geometric plane having a substantially perpendicular orientation with respect to the current direction, and where the each individual sensor is mounted on an individual sensing reference axis, where the individual sensing reference axis is a line lying in the sensing plane and passing through the individual field sensing location, and where the each individual sensor is oriented such that the first direction and the second direction both lie in the sensing plane, such that a quantity of individual field sensing locations exist, where the quantity of individual field sensing locations is equal to the quantity of the one or more magnetic field sensors, and each individual field sensing location in the quantity of individual field sensing locations is unique from any other individual field sensing location in the quantity of individual field sensing locations; and a processor in data communication with the input current measurement device and receiving the current signal output, and the processor in data communication with the each individual sensor and receiving the first output and the second output from the each individual sensor, and the processor capable of formulating, for the each individual sensor, Biot-Savart superposition equations having the form, $$B_1 = m_1 l \left[ \left( \sum_{i=1}^{n} (\sin\Theta_{Mi}/(nd_{Mi})) \right) - a \right],$$

$$B_2 = m_2 l \left[ \left( \sum_{i=1}^{n} (\cos\Theta_{Mi}/(nd_{Mi})) \right) - b \right],$$

where n = the quantity of electric arcs, $B_1$ is the first output from the each individual sensor, $B_2$ is the second output from the each individual sensor, l is the total current, $\Theta_{Mi}$ is an unknown variable representing an angle between the sensing reference axis for the each individual sensor and an ith sensing point vector, where the ith sensing point vector originates at the individual field sensing location for the each individual sensor and terminates at an unknown point where an the ith electric arc in the quantity of electric arcs intersects the sensing plane, $d_{Mi}$ is an unknown variable representing the length of the ith sensing point vector, and $m_1$, $m_2$, a and b are mathematical constants specific to the arc furnace and the input current and determined through a procedure generating calibration data, and the processor capable of expressing all $\Theta_{Mi}$ and $d_{Mi}$ referenced to a common point based on the relative locations of all individual sensing locations, such that the processor receives data from all of the each individual sensors and produces a set of formulated equations, and the set of formulated equations has a quantity of equations at least equal to a quantity of unknowns in the set of formulated equations, and the processor capable of simultaneously solving the set of formulated equations and determining a location for each current vector in the quantity of current vectors relative to the common point, thereby localizing the quantity of electric arcs in the arc furnace, where the arc furnace has an electrode gap and the quantity of electric arcs crosses the electrode gap, and where the arc furnace produces a magnetostatic field in response to an input current and the quantity of electric arcs is a known quantity equal to one or more.

10. The apparatus of claim 9 where the procedure generating calibration data to determine $m_1$, $m_2$, a and b specific to the arc furnace is comprised of:

determining a scaling factor, where the scaling factor is equal to the total current divided by the magnitude of the input current; and determining $m_1$, $m_2$, a and b for each individual field sensing location in the quantity of individual field sensing locations by, establishing a finite element network describing the arc furnace and manipulating the finite element network such that when a simulated input current is supplied, a simulated current vector passes through the sensing plane at a current location point, where the simulated current vector has a direction equivalent to the current direction, and where the simulated current vector has a magnitude equal to the simulated input current times the scaling factor, where the current location point is located on the sensing plane and within an arc furnace boundary, where the arc furnace boundary is the intersection of the arc furnace and the sensing plane, and where the current location point has a known location relative to the each individual field sensing location, conducting magnetic finite element analysis using the finite element network with the simulated input current and using the magnetic finite element analysis to determine a simulated individual magnetic field measurement at the each individual sensing location, where the simulated individual magnetic field measurement is a magnetic field vector lying in the sensing plane at the each individual sensing location, and where the magnetic field vector is expressed as a first component in the first direction of the each individual sensing location and a second component in the second direction of the each individual sensing location, generating a calibration datum point by correlating the current location point, the magnitude of the simulated current vector, and the simulated individual magnetic field measurement, generating calibration data, where the calibration data is a plurality of calibration datum points, by maintaining the value of the scaling factor and repeating the establishing a finite element network describing the electrical device and manipulating the finite element network step, the conducting magnetic finite element analysis using the finite element network step, and the generating a calibration datum point step for a plurality of current location points, mapping the calibration data to determine $m_1$, $m_2$, a and b for the each individual field sensing location using the Biot-Savart superposition equations having the form, $$B_x = m_1 l_{SIM}(\sin \Theta_{SIM}/d_{SIM} - a),$$

$$B_y = m_2 l_{SIM}(\cos \Theta_{SIM}/d_{SIM} - b), \text{where}$$

$B_x$ is the first component of a given simulated individual magnetic field measurement in the calibration data, $B_y$ is the second component of the given simulated individual magnetic field measurement in the calibration data, $l_{SIM}$ is the magnitude of the simulated current vector correlated with the given simulated individual magnetic field measurement in the calibration data, $\Theta_{SIM}$ is an angle between the sensing reference axis for the each individual field sensing location and a location point vector, where the location point vector originates at the each individual field sensing location and terminates at the current location point correlated with the given simulated individual magnetic field measurement in the calibration data, and $d_{SIM}$ is the length of the location point vector, such that $m_1$, $m_2$, a and b are determined and the Biot-Savart superposition equations fit the calibration data to within a desired level of agreement, thereby determining $m_1$, $m_2$, a and b for the each individual field sensing location, thereby generating calibration data to determine $m_1$, $m_2$, a and b specific to the arc furnace.

11. The apparatus of claim 10 where manipulating the finite element network is comprised of manipulating the properties of finite element cells in the electrode gap of the arc furnace.

12. The apparatus of claim 9 where each current vector in the quantity of current vectors has an equal magnitude.

13. The apparatus of claim 12 where the quantity of the one or more magnetic field sensors is equal to the quantity of current vectors.

14. The apparatus of claim 13 where the first direction of the each individual sensor and the second direction of the each individual sensor are orthogonal.

15. The apparatus of claim 14 where the input current has a frequency less than or equal to 60 hz.

16. The apparatus of claim 9 where the procedure generating calibration data to determine $m_1$, $m_2$, a and b specific to the arc furnace is comprised of:

determining a scaling factor, where the scaling factor is equal to the magnitude of the total current divided by the magnitude of the input current; and determining $m_1$, $m_2$, a and b for each individual field sensing location in the quantity of individual field sensing locations by, providing a model input current to the electrical device and manipulating the arc furnace such that a model current vector passes through the electrode gap at a current location point, where the model current vector has a direction equivalent to the current direction, and where the model current vector has a magnitude equal to the model input current times the scaling factor, where the current location point is located on the sensing plane and within an arc furnace boundary, where the arc furnace boundary is the intersection of the arc furnace and the sensing plane, and where the current location point has a known location relative to the each individual field sensing location, measuring a model magnetic field measurement at the each individual field sensing location using the one or more magnetic field sensors at the each individual field sensing location, where the model magnetic field measurement is expressed as a first component in the first direction and a second component in the second direction;

generating a calibration datum point by correlating the current location point, the magnitude of the model current vector, and the model magnetic field measurement in calibration data;

generating calibration data, where the calibration data is a plurality of calibration datum points, by maintaining the value of the scaling factor and repeating the providing a model input current to the electrical device step, the measuring a model magnetic field measurement step, and the generating a calibration datum point step for a plurality of current location points, mapping the calibration data to determine $m_1$, $m_2$, a and b for the each individual field sensing location using the Biot-Savart superposition equations having the form, $$B_x = m_1 l_{MEAS}(\sin \Theta_{MEAS}/d_{MEAS} - a),$$

$$B_y = m_2 l_{MEAS}(\cos \Theta_{MEAS}/d_{MEAS} - b), \text{where}$$

$B_x$ is the first component of a given model magnetic field measurement in the calibration data, $B_y$ is the second component of the given model magnetic field measurement in the calibration data, $l_{MEAS}$ is the magnitude of the model current vector correlated with the given model magnetic field measurement in the calibration data, $\Theta_{MEAS}$ is an angle between the sensing reference axis for the each individual field sensing location and a location point vector, where the location point vector originates at the each individual field sensing location and terminates at the current location point correlated with the given model magnetic field measurement in the calibration data, and $d_{MEAS}$ is the length of the location point vector, such that $m_1$, $m_2$, a and b are determined and the Biot-Savart superposition equations fit the calibration data to within a desired level of agreement, thereby determining $m_1$, $m_2$, a and b for the each individual field sensing location, thereby generating calibration data to determine $m_1$, $m_2$, a and b specific to the arc furnace.

* * * * *